(12) United States Patent
Li et al.

(10) Patent No.: US 10,804,716 B2
(45) Date of Patent: Oct. 13, 2020

(54) METHOD AND SYSTEM FOR CHARGING A BATTERY

(71) Applicant: Bose Corporation, Framingham, MA (US)

(72) Inventors: Xin Li, Wellesley, MA (US); Christopher Barnes, Lynnfield, MA (US)

(73) Assignee: Bose Corporation, Framingham, MA (US)

( * ) Notice: Subject to any disclaimer, the term of this patent is extended or adjusted under 35 U.S.C. 154(b) by 399 days.

(21) Appl. No.: 15/783,058

(22) Filed: Oct. 13, 2017

(65) Prior Publication Data

US 2019/0115773 A1 Apr. 18, 2019

(51) Int. Cl.
*H02J 7/04* (2006.01)
*H02J 7/00* (2006.01)
*G01R 31/385* (2019.01)
*G01R 31/389* (2019.01)

(52) U.S. Cl.
CPC .......... *H02J 7/0031* (2013.01); *G01R 31/385* (2019.01); *G01R 31/389* (2019.01); *H02J 7/00* (2013.01); *H02J 7/0029* (2013.01); *H02J 7/0069* (2020.01)

(58) Field of Classification Search
CPC ........... Y02E 60/12; H02J 7/14; H02J 7/0068; H01M 10/441; H01M 10/44
See application file for complete search history.

(56) References Cited

U.S. PATENT DOCUMENTS

| 5,640,079 A * | 6/1997 | Nelson | H02J 7/0071 320/153 |
| 5,982,153 A * | 11/1999 | Nagai | H02J 7/025 320/164 |
| 2004/0164702 A1* | 8/2004 | Holmes | H02J 9/061 320/101 |
| 2005/0194933 A1 | 9/2005 | Arnold et al. | |
| 2009/0261786 A1 | 10/2009 | Hsu et al. | |
| 2010/0013437 A1 | 1/2010 | Poff | |
| 2010/0295503 A1* | 11/2010 | Bourilkov | H02J 7/0068 320/106 |

(Continued)

FOREIGN PATENT DOCUMENTS

EP 2677625 12/2013

OTHER PUBLICATIONS

International Search Report and the Written Opinion of the International Searching Authority, International Application No. PCT/US2018/054942, pp. 1-12, dated Dec. 20, 2018.

(Continued)

*Primary Examiner* — Arun C Williams
(74) *Attorney, Agent, or Firm* — Bond, Schoeneck & King, PLLC

(57) ABSTRACT

A method of charging a cell of a battery includes the steps of: applying a test current to an input terminal of the battery; measuring a voltage output, wherein the voltage output is comprised of a voltage of the cell and a voltage drop, induced by the test current, across an internal impedance of the battery; and applying a charging current to the input terminal of the battery if the measured voltage output is higher than a predetermined voltage, wherein the charging current is greater than the test current.

16 Claims, 3 Drawing Sheets

(56) References Cited

U.S. PATENT DOCUMENTS

| | | | |
|---|---|---|---|
| 2013/0154654 A1* | 6/2013 | Bucsa | H02H 3/087 324/426 |
| 2015/0001930 A1* | 1/2015 | Juntunen | H02J 7/0068 307/24 |
| 2016/0020618 A1 | 1/2016 | Yang et al. | |
| 2017/0264123 A1* | 9/2017 | Mulawski | H02J 7/0021 |

OTHER PUBLICATIONS

Seiko Instruments, Inc., Battery Protection IC for 4-Series or 5-Series Cell Pack, pp. 1-32, Jun. 2014, Available at: https://cdn.sparkfun.com/assets/learn_tutorials/2/5/1/S8205A_B_E.pdf.

Ablic, Inc., Battery Protection IC with Cell-Balance Function, pp. 1-26, 2018, Available at: https://www.ablic.com/en/doc/datasheet/battery_protection/S8209B_E.pdf.

International Preliminary Report on Patentability, International Application No. PCT/US2018/054942, pp. 1-7, dated Apr. 14, 2020.

\* cited by examiner

METHOD AND SYSTEM FOR CHARGING A BATTERY

BACKGROUND

This disclosure relates to methods, devices, and systems for charging a battery.

SUMMARY

All examples and features mentioned below can be combined in any technically possible way.

In one aspect, a method of charging a cell of a battery includes the steps of: applying a test current to an input terminal of the battery; measuring a voltage output, wherein the voltage output comprises a voltage of the cell and a voltage drop, induced by the test current, across at least an internal impedance of the battery; and applying a charging current to the input terminal of the battery if the measured voltage output is higher than a predetermined voltage, wherein the charging current is greater than the test current.

Embodiments may include one of the following features, or any combination thereof. The voltage drop across the internal impedance of the battery, induced by the test current, may be relatively small compared to the voltage of the cell of the battery. The voltage drop across the internal impedance of the battery, induced by the test current, may be less than ten percent of the voltage output. The test current may be applied by a first power source and the charging current may be applied by a second power source. The test current may be less than or equal to 10 mA. Embodiments may include one of the following features, or any combination thereof. The test current may pass through a protection circuit before being applied to the input terminal of the battery such that the voltage output further comprises a voltage drop, induced by the test current, across the protection circuit. The battery protection circuit may be in a disconnect state, wherein the battery is disconnected from the load. The test current may pass through at least one trace before being applied to the input terminal of the battery such that the voltage output further comprises a voltage drop, induced by the test current, across the at least one trace. A cumulative voltage drop across the internal impedance of the battery, the protection circuit, and the at least one trace, induced by the test current, may be relatively small compared to the voltage of the cell of the battery. The cumulative voltage drop is less than ten percent of the voltage output.

In another aspect, a system for charging a cell of a battery includes a power source configured to deliver a test current to an input terminal of the battery; a controller configured to: measure a voltage output, wherein the voltage output is comprised of a voltage of the cell and a voltage drop, induced by the test current, across an at least internal impedance of the battery; compare the measured voltage output to a predetermined threshold; and apply a charging current to the input terminal of the battery if the measured voltage output is higher than a predetermined voltage, wherein the charging current is greater than the test current.

Embodiments may include one of the following features, or any combination thereof. The voltage drop across the internal impedance of the battery, induced by the test current, may be relatively small compared to the voltage of the cell of the battery. The voltage drop across the internal impedance of the battery, induced by the test current, may be less than ten percent of the voltage output. The test current may be applied by a first power source and the charging current may be applied by a second power source. The test current may be less than or equal to 10 mA. Embodiments may include one of the following features, or any combination thereof. The test current may pass through a protection circuit before being applied to the input terminal of the battery such that the voltage output further comprises a voltage drop, induced by the test current, across the protection circuit. The battery protection circuit may be in a disconnect state, wherein the battery is disconnected from the load. The test current may pass through at least one trace before being applied to the input terminal of the battery such that the voltage output further comprises a voltage drop, induced by the test current, across the at least one trace. A cumulative voltage drop across the internal impedance of the battery, the protection circuit, and the at least one trace, induced by the test current, may be relatively small compared to the voltage of the cell of the battery. The cumulative voltage drop is less than ten percent of the voltage output.

DETAILED DESCRIPTION

Certain types of batteries, such as lithium ion batteries, may not be charged after being discharged beyond a particular voltage referred to in this disclosure as the inhibit voltage. Discharging the battery beyond the inhibit voltage will result in steep decline of the life of the battery, and recharging the battery after it has been discharged beyond the inhibit voltage may be unsafe. Battery protection circuits function to disconnect the battery from a load once the battery has been discharged beyond a predetermined voltage above the inhibit voltage, which protects the battery from being discharged beyond the inhibit voltage. However, once the protection circuit has disconnected the battery from the load, the voltage of the battery may not be accurately read to determine if the battery may be safely charged. Therefore, there is a need in the art for a system and method to accurately determine the voltage of the battery after the protection circuit has disconnected the battery.

Figure 1:
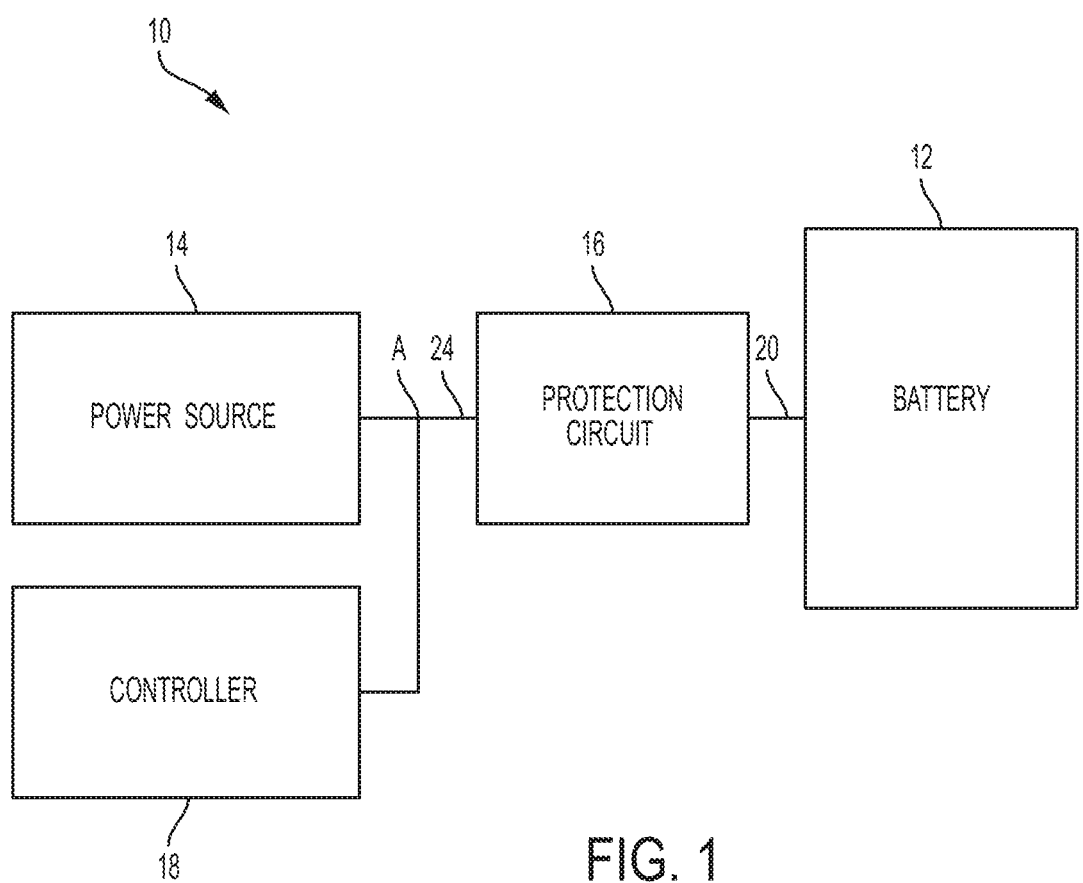
FIG. 1 is a schematic of an example system for charging a battery.

FIG. 1 depicts a schematic of a system 10 for charging a battery. As shown, the system may include a battery 12, a power source 14 configured to deliver one of a test current or a charging current, a protection circuit 16 disposed between the power source and the battery and configured to disconnect the battery from a load once the voltage of the battery falls below a predetermined voltage, and a controller 18 configured to measure a voltage of the battery, the voltage being induced by the test current, and determine whether to apply the charging current. The test current may be relatively small compared to the charging current to minimize the effects of the internal impedance of the battery, and other intervening impedances, on the measured voltage.

Battery 12 may include one or more cells and may exhibit an internal impedance. Battery 12 may further exhibit, as discussed above, an inhibit voltage, which, for the purposes of this disclosure, is the voltage above which the cell may be safely charged and/or below which the cell is stressed and lifetime of the cell is reduced (e.g, by a steep increase in internal impedance). This voltage is typically around 2.4 V per cell of the battery; however, as battery technology develops, different batteries may have different inhibit voltages. Battery 12 may be any type of battery that exhibits an internal impedance and an inhibit voltage, such as a lithium-ion battery or a lead-acid battery.

The power source 14 may be, for example, a current source coupled to provide a test current, $I_{test}$, or a charging current, $I_{charging}$, to an input terminal 20 of battery 12. The input terminal 20 may be any input of battery 12 suitable for receiving an electrical current by which at least one cell of battery 12 may be charged.

Figure 2:
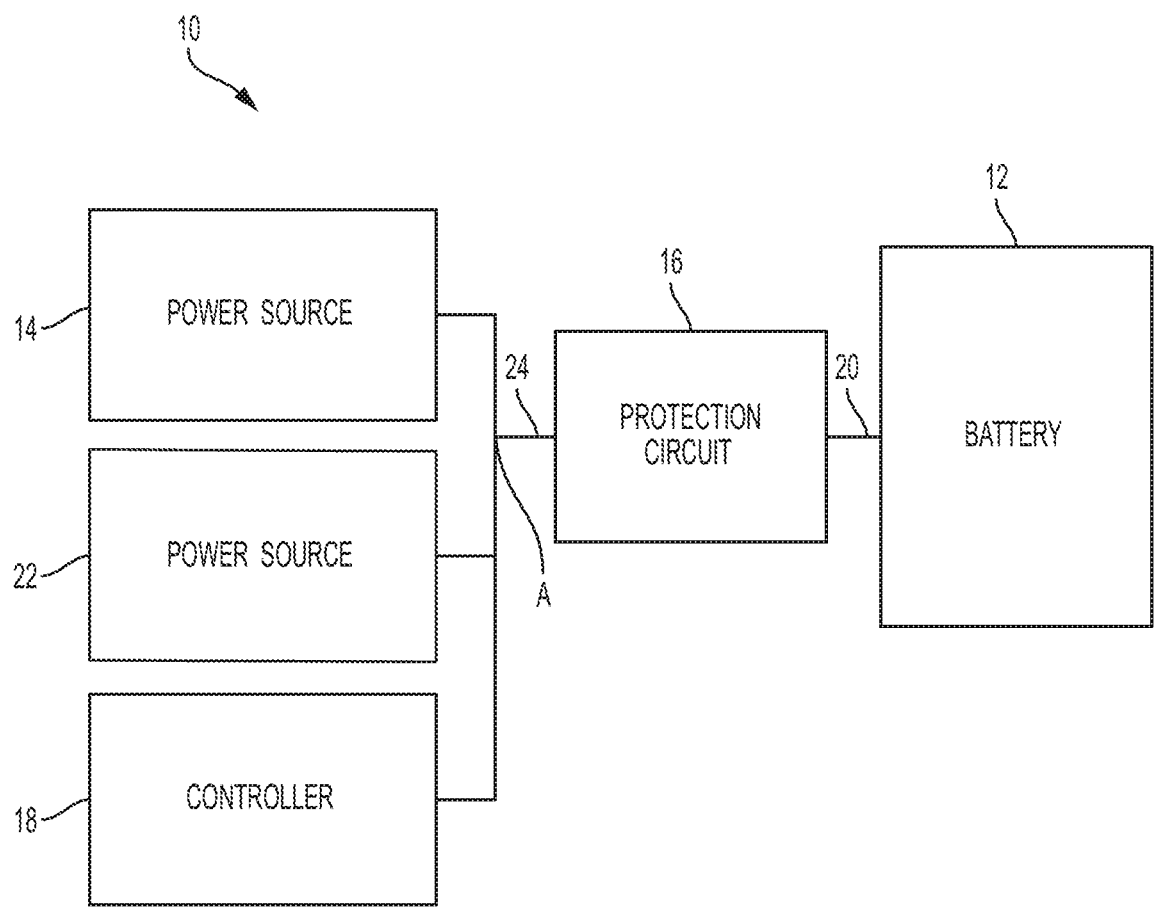
FIG. 2 is a schematic of an example system for charging a battery.

The power source 14 may be an integrated circuit, configured to provide current to the input terminal 20 of battery 12. For example, power source may be a DC-DC charging circuit such as the MAX8971 offered by Maxim Integrated, which is capable of delivering a 1.55 A charging current to a lithium ion battery. As shown in FIG. 1, power source 14 may be a single power source capable of delivering both test current $I_{test}$ and charging current $I_{charging}$. However, because most power sources are not capable of delivering two significantly different current levels, power source 14 may be comprised instead of two power sources, as shown in FIG. 2: a first power source 14 for applying test current $I_{test}$ and a second power source 22 for applying charging current $I_{charging}$. These power sources, 14 and 22, may, for example, be coupled to input terminal 20 in parallel such that each may deliver its respective current independently.

Protection circuit 16 may be disposed between power source 14 and the input terminal 20 of battery 12 and be operable to disconnect battery 12 from a load when the charge of the battery drops below a predetermined value $V_{UVP}$, the predetermined value being higher than the inhibit voltage of the battery. Protection circuit 16 may thus be configured to measure the voltage of one or more cells of battery 12 and to compare the measured voltage against a predetermined threshold voltage $V_{UVP}$. If the measured voltage is lower than threshold voltage $V_{UVP}$, protection circuit 16 disconnects battery 12 from a load. Disconnecting battery 12 from a load may be accomplished by, for example, disconnecting one or more transistors or FETs, disposed between the terminal 20 (or other terminal) of battery 12, in an off-state.

Figure 3:
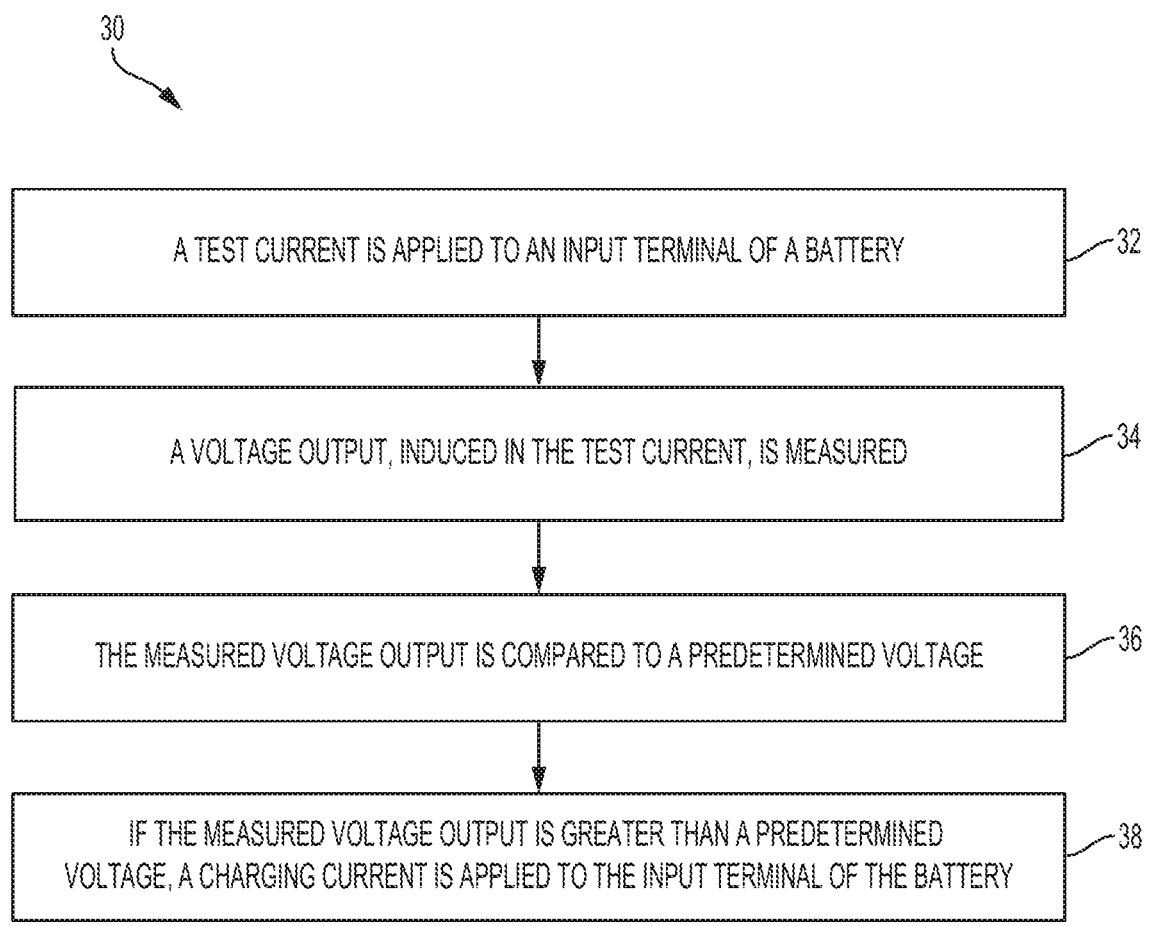
FIG. 3 is a flowchart of an example method for charging a battery.

Controller 18 may be, for example, a microcontroller or other integrated circuit including a non-transitory storage medium and being programmed to carry out the steps of the method of FIG. 3. Controller 18 may, for example, be part of the same integrated circuit as power source 14. Alternately, controller 18 may be separate from power source 14. As will be discussed in connection with the method of FIG. 3, controller may be configured to measure a voltage at point A as shown in FIGS. 1 and 2. Controller 18 may be configured to apply charging current $I_{charging}$ if the measured voltage is above a predetermined threshold. In this context, applying charging current $I_{charging}$ may be accomplished by causing charging current $I_{charging}$ to be applied to input terminal 20 of battery 12. For example, controller 18 may communicate with power source 14 (or, in an alternate embodiment 22) that charging current $I_{charging}$ should be delivered to the input terminal 20. Alternately, controller may place a transistor/FET, positioned between power source 14 (or 22) and input terminal 20, in an on-state, such that charging current $I_{charging}$ is delivered to input terminal 20.

Alternately, controller 18 may be a circuit, integrated or otherwise, and structured to carry out the steps of the method of FIG. 3. For example, controller 18 may include a comparator configured to measure a voltage at point A, and, depending on whether the measured voltage is above a predetermined threshold, activate a switch connecting input terminal 20 of battery to a power source, 14 or 22, delivering charging current $I_{charging}$. This topology is merely an example of one circuit that may be used, and other topologies may be used to measure the voltage and determine whether to apply the charging current.

FIG. 3 depicts a flowchart 30 of a method for determining whether to apply a charging current to a battery. At step 32, a test current $I_{test}$ is applied to input terminal 20 of battery 12. Test current $I_{test}$ is applied to induce a voltage output that may be measured by controller 18. When the test current is applied, the battery protection circuit 16 may be either in a disconnect or connect state.

At step 34, the voltage output, induced by test current $I_{test}$, is measured by controller 18. The voltage output may be measured, for example, at point A, as shown on FIG. 1, and may thus include the voltage drop across the protection circuit 16, $V_{prot}$, the voltage drop across the internal impedance of battery 12, $V_{int}$, and the voltage drop introduced by the impedance of wiring/traces 24 that connect power source 14 to battery 12, $V_{trace}$, as a result of the application of test current $I_{test}$. The measured voltage will also include the voltage of at least one cell of battery 12, $V_{bat}$. Measured voltage $V_{out}$ may therefore be represented according to equation (1):

$$V_{out} = V_{bat} + V_{int} + V_{prot} + V_{trace} \quad \text{Eq. (1)}$$

In alternate embodiments, the voltage induced by test current $I_{test}$ may be measured elsewhere in the circuit beside point A; however, measuring as close as possible to the input terminal 20 battery 12 will reduce other impedances which may distort the measured voltage $V_{out}$.

Because the internal impedance of battery 12 may be large, the component of $V_{out}$ attributable to the voltage drop across the internal impedance of battery 12, $V_{int}$, can result in measuring a voltage output that is much larger than $V_{bat}$ and therefore cannot be used to determine whether the voltage of the cells of battery 12 have fallen below the inhibit voltage $V_{inhibit}$. Accordingly, test current $I_{test}$ should be relatively small as compared to charging current $I_{charging}$, to minimize the voltage drops across the internal impedance of battery 12, as well as protection circuit 16, wiring/traces 24, and any other intervening impedances. In other words, the test current $I_{test}$ should be selected so that the voltage drops across the internal impedance of the battery 12, $V_{int}$, the protection circuit, $V_{prot}$, and the wiring/traces, $V_{trace}$, are relatively small compared to the voltage of the cell $V_{bat}$, such that the voltage output $V_{out}$ closely approximates the voltage of $V_{bat}$. Indeed, if the voltage drops introduced by test current $I_{test}$ are negligibly small, measured voltage $V_{out}$ may be represented according to equation (2):

$$V_{out} \approx V_{bat} \quad \text{Eq.(2)}$$

This permits a relatively accurate measurement of the voltage of the cells of battery 12.

In an embodiment, the magnitude of the test current $I_{test}$ may be less than or equal to 10 mA, while the magnitude of the charging current $I_{charging}$ may be around 600 mA. In other embodiments, the magnitude of the test current may be selected such that the voltage drop across the internal impedance of the battery is less than ten percent of the measured voltage output. Although the internal impedance of battery 12 is not directly known when test current $I_{test}$ is applied, test current $I_{test}$ may be selected to impart a relatively small voltage drop across the internal impedance of the battery when the battery is at or near the inhibit voltage $V_{inhibit}$. For example, if the internal impedance of battery 12 is known to be approximately 300 mOhms when the voltage of the cell is 2.5 V, then the voltage drop across the internal resistance can be expected to be 3.0 mV in response to a 10 mA test current $I_{test}$, approximately 0.1% of a percent of the voltage of the cell at the inhibit voltage. These values are merely used as examples. Similarly, because the impedances of the traces 24 and of the protection circuit 16 are known, these values may be used in conjunction with the approximated value of the internal impedance of battery 12 at the inhibit voltage to select a test current $I_{test}$. The magnitude of the test current $I_{test}$ may be thus selected such that the cumulative voltage drop across these impedances (or any combination of these impedances) results in less than ten percent of the measured voltage $V_{out}$. Alternately, the magnitude of the test current $I_{test}$ may be selected such that the cumulative voltage drop across the impedances results in less than ten percent of the voltage of the cell $V_{bat}$.

At step 36, the measured output voltage may be compared to a predetermined value. In one embodiment, the predetermined value may be the inhibit voltage of the cell of the battery. In an alternate embodiment, because the measured voltage output will necessarily be greater than the voltage of the cell, the predetermined value may be set at a value greater than the inhibit voltage of the cell to account for the additional voltage drops introduced by the internal impedance of the battery and the battery protection circuit and traces. For example, if the additional voltage drops are expected to introduce a ten percent increase in the measured output voltage when the voltage of the cell is at the inhibit voltage, the predetermined voltage may be set at ten percent higher than the inhibit voltage. In this way, the predetermined voltage may be set to account for the error introduced by the additional impedances.

At step 38, if the measured voltage is greater than a predetermined voltage, the charging current is applied by controller 18. Again, as outlined above, this step may be accomplished by controller 18 notifying power source 14 to begin applying the charging current, or otherwise causing the application of the charging current, such as by setting a transistor or FET in an on-state. If the measured voltage is less than the predetermined voltage, the controller 18 does not apply the charging as it may be unsafe to charge battery 12. If this occurs, a user may be notified by controller 18, via a user interface or an indicator light, that the battery may not be safely charged.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, and/or method described herein. In addition, any combination of two or more such features, systems, articles, materials, and/or methods, if such features, systems, articles, materials, and/or methods are not mutually inconsistent, is included within the inventive scope of the present disclosure.

What is claimed is:

1. A method of charging a cell of a battery, comprising:
   applying a test current to an input terminal of the battery;
   measuring a voltage output, wherein the voltage output comprises a voltage of the cell and a voltage drop, induced by the test current, across at least an internal impedance of the battery, wherein the voltage drop across the internal impedance of the battery, induced by the test current, is less than ten percent of the voltage output; and
   applying a charging current to the input terminal of the battery if the measured voltage output is higher than a predetermined voltage, wherein the charging current is greater than the test current.

2. The method of claim 1, wherein the test current is applied by a first power source and the charging current is applied by a second power source.

3. The method of claim 1, wherein the test current passes through a protection circuit before being applied to the input terminal of the battery such that the voltage output further comprises a voltage drop, induced by the test current, across the protection circuit.

4. The method of claim 3, wherein the battery protection circuit is in a disconnect state, wherein the battery is disconnected from a load.

5. The method of claim 3, wherein the test current passes through at least one trace before being applied to the input terminal of the battery such that the voltage output further comprises a voltage drop, induced by the test current, across the at least one trace.

6. The method of claim 5, wherein a cumulative voltage drop across the internal impedance of the battery, the protection circuit, and the at least one trace, induced by the test current, is relatively small compared to the voltage of the cell of the battery.

7. The method of claim 6, wherein the cumulative voltage drop is less than ten percent of the voltage output.

8. The method of claim 1, wherein the test current is less than or equal to 10 mA.

9. A system for charging a cell of a battery, comprising:
   a power source configured to deliver a test current to an input terminal of the battery;
   a controller configured to:
      measure a voltage output, wherein the voltage output comprises a voltage of the cell and a voltage drop, induced by the test current, across at least an internal impedance of the battery, wherein the voltage drop across the internal impedance of the battery, induced by the test current, is less than ten percent of the voltage output;
      compare the measured voltage output to a predetermined voltage; and
      apply a charging current to the input terminal of the battery if the measured voltage output is higher than the predetermined voltage, wherein the charging current is greater than the test current.

10. The system of claim 9, wherein the test current is applied by a first power source and the charging current is applied by a second power source.

11. The system of claim 9, wherein the test current passes through a protection circuit before being applied to the input terminal of the battery such that the voltage output further comprises a voltage drop, induced by the test current, across the protection circuit.

12. The system of claim 11, wherein the battery protection circuit is in a disconnect state, wherein the battery is disconnected from a load.

13. The system of claim 11, wherein the test current passes through at least one trace before being applied to the input terminal of the battery such that the voltage output further comprises a voltage drop, induced by the test current, across the at least one trace.

14. The system of claim 13, wherein a cumulative voltage drop across the internal impedance of the battery, the protection circuit, and the at least one trace, induced by the test current, is relatively small compared to the voltage of the cell of the battery.

15. The system of claim 14, wherein the cumulative voltage drop is less than ten percent of the voltage output.

16. The system of claim 9, wherein the test current is less than or equal to 10 mA.

* * * * *